(12) United States Patent
Egashira et al.

(10) Patent No.: US 7,190,045 B2
(45) Date of Patent: Mar. 13, 2007

(54) SEMICONDUCTOR DEVICE AND METHOD FOR FABRICATING THE SAME

(75) Inventors: Kyoko Egashira, Toyama (JP); Shin Hashimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 183 days.

(21) Appl. No.: 10/812,880

(22) Filed: Mar. 31, 2004

(65) Prior Publication Data

US 2004/0253783 A1    Dec. 16, 2004

(30) Foreign Application Priority Data

Mar. 31, 2003    (JP) .............................. 2003-094213

(51) Int. Cl.
*H01L 29/00*    (2006.01)

(52) U.S. Cl. .................. 257/532; 257/68; 257/296; 257/E21; 257/11; 257/E21; 257/647; 257/E27; 257/48

(58) Field of Classification Search ................ 257/296, 257/68, 300, 301, 303, 304, 306, 308, 310, 257/298, 532
See application file for complete search history.

(56) References Cited

U.S. PATENT DOCUMENTS

| | | | |
|---|---|---|---|
| 6,175,131 B1 * | 1/2001 | Adan ........................... 257/306 |
| 6,300,239 B1 * | 10/2001 | Ono ............................ 438/633 |
| 6,320,213 B1 * | 11/2001 | Kirlin et al. ................. 257/295 |
| 6,384,442 B1 * | 5/2002 | Chen .......................... 257/298 |
| 6,500,724 B1 * | 12/2002 | Zurcher et al. ............. 438/384 |
| 6,555,428 B2 * | 4/2003 | Jung .......................... 438/239 |
| 6,709,918 B1 * | 3/2004 | Ng et al. ..................... 438/253 |
| 6,825,092 B2 * | 11/2004 | Zurcher et al. ............. 438/384 |
| 6,893,935 B2 * | 5/2005 | Lachner ...................... 438/396 |

FOREIGN PATENT DOCUMENTS

| | | |
|---|---|---|
| JP | 62-42553 A | 8/1985 |
| JP | 01-223757 A | 3/1988 |
| JP | 2001-203329 A | 1/2000 |
| JP | 2001-358304 | 12/2001 |
| KR | 2000-0023348 | 4/2000 |

* cited by examiner

*Primary Examiner*—David Nhu
(74) *Attorney, Agent, or Firm*—McDermott Will & Emery LLP

(57) ABSTRACT

A semiconductor device is composed of: an interconnect made of a first conductive film and a second conductive film that are stacked in sequence from the interconnect underside on an insulating film formed on a substrate; and a capacitor composed of a lower capacitor electrode made of the first conductive film, a dielectric film formed on the lower capacitor electrode, and an upper capacitor electrode made of the second conductive film and formed on the dielectric film.

8 Claims, 8 Drawing Sheets

US 7,190,045 B2

SEMICONDUCTOR DEVICE AND METHOD FOR FABRICATING THE SAME

BACKGROUND OF THE INVENTION

The present invention relates to semiconductor devices and methods for fabricating the devices, and more particularly relates to semiconductor devices which have a MIM (metal-insulator-metal) capacitor and a resistor for use in an analog circuit, e.g., and a method for fabricating the semiconductor devices.

MIM capacitors which have a dielectric film between an upper capacitor electrode and a lower capacitor electrode, or resistors are often incorporated as passive elements into a semiconductor integrated circuit device in which analog circuits are laid out.

FIG. 9 is a cross sectional view illustrating the structure of a conventional MIM capacitor used in integrated analog circuits.

Shown in FIG. 9 is an example of a conventional MIM capacitor device used in semiconductor integrated analog circuits, where a lower capacitor electrode 101a and a first interconnect 101b, both of which are made of a first conductive film 101, are formed on a first insulating layer 100 fabricated over a semiconductor substrate (not shown), and an inner surface of a large opening 102a formed in a second insulating layer 102 is covered by a dielectric film 103 serving as the MIM insulator, and an upper capacitor electrode 104a made of a second conductive film 104 is formed over the dielectric film 103 while an inner surface of a contact hole 102b formed through the second insulating film 103 to the first interconnect 101b is covered by the second conductive film 104 to form a second interconnect 104b so as to constitute an ordinary two-level interconnect system.

FIG. 10 is a cross sectional view of the structure of a MIM capacitor different from the structure shown in FIG. 9, which illustrates a typical MIM capacitor which employs planarized W plug contacts in a semiconductor integrated circuit. In particular, in a large scale integration circuit (LSI) semiconductor having submicron devices, a planarized structure such as shown in FIG. 10 is adopted to achieve improved process capabilities of lithographic patterning steps, which otherwise would be affected by un-planarized surface topology.

As shown in FIG. 10, a first interconnect 201 is formed on an insulating film 200 formed on a semiconductor substrate (not shown.) On the first interconnect 201 serving as a lower capacitor electrode, a dielectric film 202 and an upper capacitor electrode 203 are formed in sequence from downward. Contacts 205a and 205b filled by a W film and planarized are formed in an insulating film 204 to connect to the upper capacitor electrode 203 and the first interconnect 201, respectively. Over the planarized W plug contacts 205a and 205b, second interconnects 206a and 206b, both made of a second conductive film 206, are formed on the insulating film 204 to form electrical connections to the upper capacitor electrode 203 and the lower capacitor electrode 201, respectively.

FIG. 11 is a cross sectional view illustrating a resistor typically used in an analog circuit in a semiconductor integrated device.

As shown in FIG. 11, an insulating film 301 for device-isolation is formed on a Si substrate 300, and a polysilicon resistor 302 of a high impurity concentration is formed on the insulating film 301, and an insulating film 303 is formed over the polysilicon resistor 302 and the insulating film 301, and contact holes 304 formed through the insulating film 303 to the polysilicon resistor 302 are filled by a W film and planarized to form W plug contacts to the polysilicon resistor 302, and second interconnects 305 are formed to make electrical connections to the polysilicon resistor 302 via the contacts 304, (See Japanese Laid-Open Publication Nos. 62-42553, 01-223757, and 2001-203329, for example.)

To form the MIM capacitor illustrated in FIG. 9, the following steps may be carried out: forming the lower capacitor electrode 101a and the first interconnect 101b, both of which are made of the first conductive layer 101 constituting a lower level of a multilevel interconnect system in the semiconductor integrated circuit; forming the upper capacitor electrode 104a and the second interconnect 104b, both of which are made of the second conductive film 104 constituting an upper level of the multilevel interconnect system in the semiconductor integrated circuit; and in addition, forming the opening 102a for forming the capacitor in the insulating film 102 and depositing the dielectric film 103. In this case, as can be seen in FIG. 9, the contact 102c formed of the second conductive film 104 on the first interconnect 10b, and the second interconnect 104b made of the second conductive film 104 are formed in the following manner. After the dielectric film 103 is deposited on the opening 102a and the insulating film 102, the contact hole 102b is formed. Next, the second interconnect layer 104 is deposited on the contact hole 102b and the dielectric film 103, and then patterned, whereby the second interconnect 104b is formed over the first interconnect 101b with the contact 102c being interposed therebetween.

Due to this structure, the following problem arises. In a densely packed LSI, the size of the contact hole 102c is submicron and the contact hole 102c have to be filled by a refractory metal film such as a W film which must be planarized by CMP (Chemical Mechanical Polishing) and etchback to form a plug contact. However, the W film formed over the large opening 102a are easily removed by the planarization techniques such as CMP and etchback, and thus the structure of FIG. 9 is not compatible with a modern submicron-device fabricating process.

In view of this, in recent years, MIM capacitors such as shown in FIG. 10 become more favorable in fabricating densely packed LSI of the submicron feature size. Nevertheless, formation of MIM capacitors having such a structure requires the process steps of depositing the dielectric film 202, depositing a metal layer which forms the upper capacitor electrode 203, and patterning the metal layer to form the upper capacitor electrode 203. After the dielectric film 202 and the upper capacitor electrode 203 have been patterned, the first interconnect 201 serving as the lower capacitor electrode is patterned. This puts a limit on the thickness of a photoresist film used in photolithographically patterning the first interconnect 201 as the lower capacitor electrode, if the difference in level, which is equal to the film thickness of the upper capacitor electrode 203, is taken into account. Furthermore, since the thickness of the insulating film 204 differs between where the insulating film 204 is on the upper capacitor electrode 203 and where it is on the first interconnect 201, the reliability of the contact 205b formed on the first interconnect 201 and the second interconnect 206b is reduced because the depth of the contact hole 205b is deeper than that of the contact hole 205a so that there exists a higher probability of having inadequate filling of the W film in the contact hole 205b.

Also, since the resistor shown in FIG. 11 is formed out of a polysilicon film which is used in a gate-electrode formation process, for example, the value of the resistor becomes higher than necessary to form an analog circuit, and varies considerably. Therefore, in a device having a structure in which a resistor and a circuit are directly connected, or having a multilayer interconnect structure inbetween, if the interconnect length from the circuit to the resistor has to be long, the parasitic resistance is increased, causing a problem in that the parasitic resistance affects the resistor value.

SUMMARY OF THE INVENTION

In view of the above problems, it is therefore an object of the present invention to provide, in a highly large scale integrated circuit device, a semiconductor device that has a MIM capacitor which can be formed with a reduced number of process steps, and a resistor in which variation in resistor value or parasitic resistance is reduced, and a method for fabricating the semiconductor device.

In order to achieve the above object, a first inventive semiconductor device includes: an interconnect made of a first conductive film and a second conductive film that are stacked in sequence from the interconnect underside on an insulating film formed on a substrate; and a capacitor composed of a lower capacitor electrode made of the first conductive film, a dielectric film formed on the lower capacitor electrode, and an upper capacitor electrode made of the second conductive film and formed on the dielectric film.

In the first inventive semiconductor device, the upper capacitor electrode is formed using the second conductive film that forms the interconnect. Therefore, unlike in the prior art examples, a new film other than the films that form the interconnect is not necessary in forming the upper capacitor electrode. Accordingly, in the highly large scale integrated circuit device, the difference in level, which is equal to the film thickness of the upper capacitor electrode, can be reduced, while the capacitor can be formed with a reduced number of process steps.

A second inventive semiconductor device includes: an interconnect made of a first conductive film and a second conductive film that are stacked in sequence from the interconnect underside on an insulating film formed on a substrate; a capacitor composed of a lower capacitor electrode made of the first conductive film, a dielectric film formed on the lower capacitor electrode, and an upper capacitor electrode made of the second conductive film and formed on the dielectric film; and an extension interconnect made of the first conductive film connected to the interconnect made of the first and second conductive films in stack.

In the second inventive semiconductor device, the lower and upper capacitor electrodes are formed using the first and second conductive films, respectively, that form the interconnect. Therefore, unlike in the prior art examples, a new film other than the films that form the interconnect is not necessary in forming the upper capacitor electrode. Accordingly, in the highly large scale integrated circuit device, the difference in level, which is equal to the film thickness of the upper capacitor electrode, can be reduced, while the capacitor can be formed with a reduced number of process steps. Moreover, in the second inventive semiconductor device, the first conductive film forming the lower capacitor electrode is used as the interconnect for the lower capacitor electrode. This allows the interconnect to have a shorter length, while suppressing the parasitic resistance and capacitance, as compared with a method such as used in the prior art example in which interconnects and contacts are formed separately and connected with a lower capacitor electrode.

A third inventive semiconductor device includes: an interconnect made of a first conductive film and a second conductive film that are stacked in sequence from the interconnect underside on an insulating film formed on a substrate; and a resistor made of the first conductive film and formed on the insulating film.

In the third inventive semiconductor device, the resistor is formed using the first conductive film that forms the interconnect. Thus, the parasitic resistance can be reduced as compared with conventional resistors, and even if the resistor is provided in series with inner interconnects in the integrated circuit, it is possible to avoid a situation in which characteristics of the integrated circuit are adversely affected by the parasitic resistance of the interconnects going toward inside.

A fourth inventive semiconductor device includes: an interconnect made of a first conductive film and a second conductive film that are stacked in sequence from the interconnect underside on an insulating film formed on a substrate; a capacitor composed of a lower capacitor electrode made of the first conductive film, a dielectric film formed on the lower capacitor electrode, and an upper capacitor electrode made of the second conductive film and formed on the dielectric film; and a resistor made of the first conductive film and formed on the insulating film.

In the fourth inventive semiconductor device, the lower and the upper capacitor electrodes are formed using the first and second conductive films, respectively, that form the interconnect. Therefore, unlike in the prior art examples, a new film other than the films that form the interconnect is not necessary in forming the upper capacitor electrode. Accordingly, in the highly large scale integrated circuit device, the difference in level, which is equal to the film thickness of the upper capacitor electrode, can be reduced, while the capacitor can be formed with a reduced number of process steps. Moreover, in the fourth inventive semiconductor device, the first conductive film forming the lower capacitor electrode is used as the interconnect for the lower capacitor electrode. This allows the interconnect to have a shorter length, while suppressing the parasitic resistance, as compared with a method such as used in the prior art example in which interconnects and contacts are formed separately and connected with a lower capacitor electrode. Furthermore, in the fourth inventive semiconductor device, the resistor is formed using the first conductive film that forms the interconnect. Thus, the parasitic resistance can be reduced as compared with conventional resistors, and even if the resistor is provided in series with inner interconnects in the integrated circuit, it is possible to avoid a situation in which characteristics of the integrated circuit are adversely affected by the parasitic resistance of the interconnects going toward inside.

In the inventive semiconductor devices, if the first conductive film is made of a metal nitride, a desired sheet resistance can be obtained for the resistor.

In the inventive semiconductor devices, an aluminum alloy, which is the main material for the interconnect, may be used as the second conductive film.

A first inventive method for fabricating a semiconductor device includes the steps of: depositing a first conductive film and a dielectric film in sequence on an insulating film formed on a substrate; selectively etching the dielectric film, thereby leaving the dielectric film where the dielectric film is located in a first region in which a capacitor is to be formed; depositing a second conductive film on the first conductive film so that the second conductive film covers the dielectric film; and selectively etching the first and second conductive films, thereby forming in a second region an interconnect made of the first and second conductive films, while forming in the first region the capacitor composed of a lower capacitor electrode made of the first conductive film, the dielectric film, and an upper capacitor electrode made of the second conductive film, the second region being different from the first region.

According to the first inventive method, the upper capacitor electrode is formed using the second conductive films that form the interconnect. Therefore, unlike in the prior art examples, a new film other than films that form the interconnect is not necessary in forming the upper capacitor electrode. Accordingly, in the highly large scale integrated circuit device, the difference in level, which is equal to the film thickness of the upper capacitor electrode, can be reduced, while the capacitor can be formed with a reduced number of process steps.

A second inventive method for fabricating a semiconductor device includes the steps of depositing a first conductive film and a dielectric film in sequence on an insulating film formed on a substrate; selectively etching the dielectric film, thereby leaving the dielectric film where the dielectric film is located in a third region in which a capacitor and an extension interconnect for a lower capacitor electrode forming the capacitor are to be formed; depositing a second conductive film on the first conductive film so that the second conductive film covers the dielectric film; and selectively etching the first and second conductive films, thereby forming in a fourth region an interconnect made of the first and second conductive films, while forming, in the third region, the extension interconnect and the capacitor composed of the lower capacitor electrode made of the first conductive film, the dielectric film, and an upper capacitor electrode made of the second conductive film, the fourth region being different from the third region.

According to the second inventive method, the upper capacitor electrode is formed using the second conductive films that form the interconnect. Therefore, unlike in the prior art examples, a new film other than the films that form the interconnect is not necessary in forming the upper capacitor electrode. Accordingly, in the highly large scale integrated circuit device, the difference in level, which is equal to the film thickness of the upper capacitor electrode, can be reduced, while the capacitor can be formed with a reduced number of process steps. Moreover, in the second inventive method, the first conductive film forming the lower capacitor electrode is used as the interconnect for the lower capacitor electrode. This allows the interconnect to have a shorter length, while suppressing the parasitic resistance, as compared with a method such as used in the prior art example in which interconnects and contacts are formed separately and connected with a lower capacitor electrode.

A third inventive method for fabricating a semiconductor device includes the steps of: depositing a first conductive film and a second insulating film in sequence on a first insulating film formed on a substrate; selectively etching the second insulating film, thereby leaving the second insulating film where the second insulating film is located in a fifth region in which a resistor is to be formed; forming a second conductive film on the first conductive film so that the second conductive film covers the second insulating film; and selectively etching the first and second conductive films, with the second insulating film being used as part of a mask, thereby forming in a sixth region an interconnect made of the first and second conductive films, while forming in the fifth region the resistor made of the first conductive film, the sixth region being different from the fifth region.

In the third inventive method, the resistor is formed using the first conductive film that forms the interconnect. Thus, parasitic resistance can be reduced as compared with conventional resistors, and even if the resistor is provided in series with inner interconnects in the integrated circuit, it is possible to avoid a situation in which characteristics of the integrated circuit are adversely affected by the parasitic resistance of the interconnects going toward inside. Moreover, since the second insulating film acts as part of the mask in the etching process, the desired resistor can be formed.

In the inventive methods, if the first conductive film is made of a metal nitride, the desired sheet resistance can be obtained.

In the inventive methods, an aluminum alloy, which is the main material for the interconnect, may be used as the second conductive film.

DESCRIPTION OF THE PREFERRED EMBODIMENTS

Hereinafter, preferred embodiments of the present invention will be described with reference to the accompanying drawings.

(First Embodiment)

Figure 1:
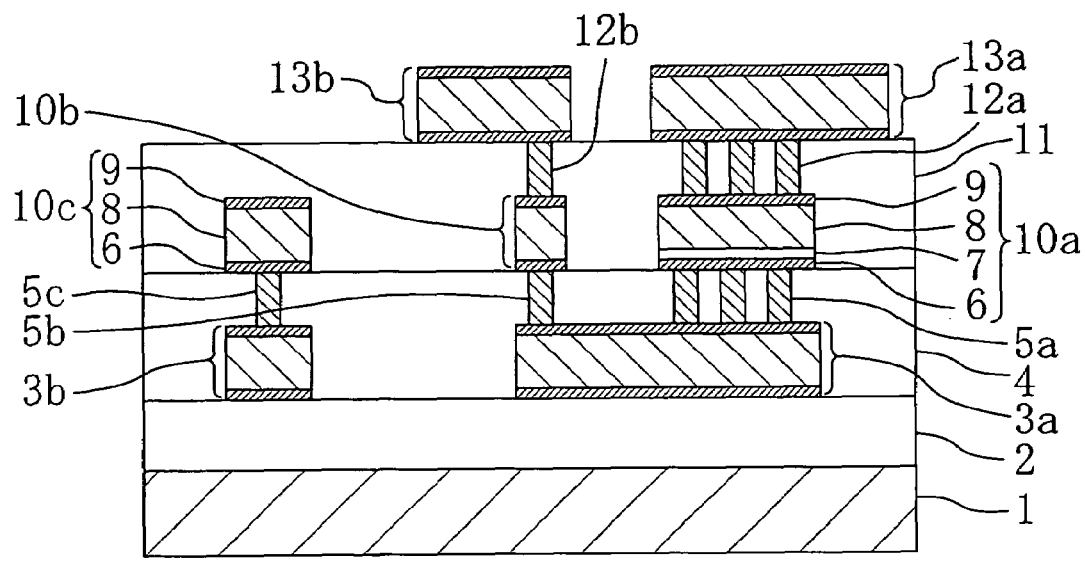
FIG. 1 is a cross sectional view of a semiconductor device in accordance with a first embodiment of the present invention.

FIG. 1 is a cross sectional view of a semiconductor device in accordance with a first embodiment of the present invention, and illustrates a MIM capacitor and interconnects.

As shown in FIG. 1, first interconnects 3a and 3b made of an identical film layer are formed on an insulating film 2 formed on a semiconductor substrate 1. A first insulating film 4 whose surface is planarized is formed so as to cover the first interconnects 3a and 3b. In the first insulating film 4, contacts 5a, 5b and 5c, which are filled with a W film, are formed. On the first insulating film 4 and the contacts 5a, a MIM capacitor 10a, which is composed of a lower capacitor electrode, a dielectric film, and an upper capacitor electrode, is formed. The lower capacitor electrode is formed of a barrier metal film 6 (a first conductive film). The dielectric film is formed of a SiO$_2$ film 7. The upper capacitor electrode is formed by sequentially stacking an AlCu film 8 (a second conductive film) and a TiN film 9.

Formed on the first insulating film 4 and the contact 5*b* are second interconnects 10*b* and 10*c*, which are formed by sequentially stacking the barrier metal film 6, the AlCu film 8, and the TiN film 9. The contacts 5*a* connect the first interconnect 3*a* and the MIM capacitor 10*a*, while the contact 5*b* connects the first interconnect 3*a* and the second interconnect 10*b*. The contact 5*c* connects the first interconnect 3*b* and the second interconnect 10*c*.

A second insulating film 11 whose surface is planarized is formed so as to cover the MIM capacitor 10*a* and the second interconnects 10*b* and 10*c*. In the second insulating film 11, contacts 12*a* and 12*b* filled with a W film are formed. Formed on the second insulating film 11 is a third interconnect 13*a*, which is connected to the MIM capacitor 10*a* via the contacts 12*a*. Another third interconnect 13*b*, which is connected to the second interconnect 10*b* via the contact 12*b*, is also formed on the second insulating film 11.

As described above, according to this embodiment, the lower and upper capacitor electrodes of the MIM capacitor 10*a* are formed by using the conductive films 6, 8, and 9 which are identical to those forming the interconnect 10*c*. This, unlike in the prior art example shown in FIG. 10, eliminates the need for using in forming the upper capacitor electrode a new conductive film other than the films that form the interconnects. Accordingly, in the LSI semiconductor having submicron devices, the difference in level, which is equal to the film thickness of the upper capacitor electrode, can be reduced, while the MIM capacitor can be formed with a reduced number of process steps.

(Second Embodiment)

Figure 2:
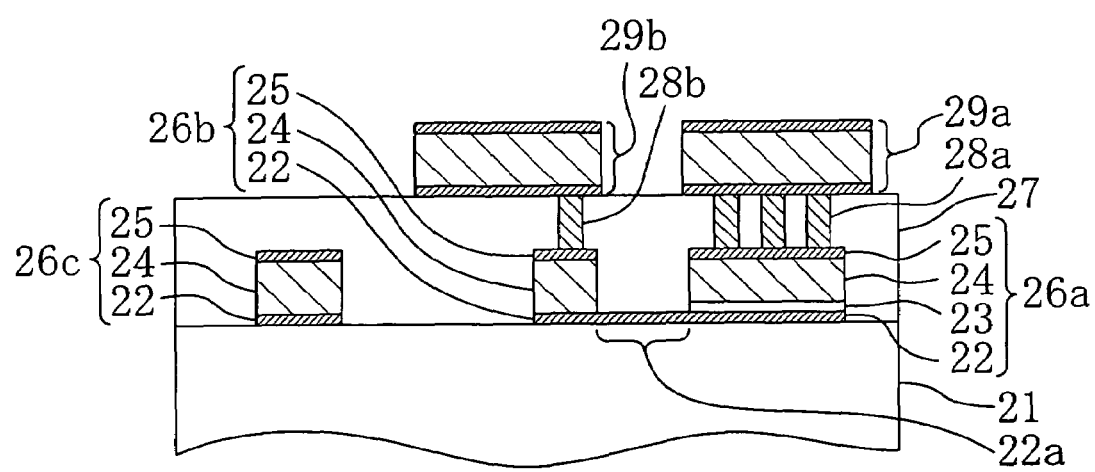
FIG. 2 is a cross sectional view of a semiconductor device in accordance with a second embodiment of the present invention.

FIG. 2 is a cross sectional view of a semiconductor device in accordance with a second embodiment of the present invention, and illustrates a MIM capacitor and its neighboring interconnects. In FIG. 2, illustration of a semiconductor substrate, an insulating film formed on the semiconductor substrate, and first interconnects formed on the insulating film, such as shown in FIG. 1, is omitted.

As shown in FIG. 2, a first insulating film 21 whose surface is planarized is formed so as to cover interconnects (not shown) formed on an insulating film. On the first insulating film 21, a MIM capacitor 26*a*, consisting of a lower capacitor electrode, a dielectric film, and an upper capacitor electrode, is formed. The lower capacitor electrode is made of a barrier metal film 22 (a first conductive film), the dielectric film is made of a SiO$_2$ film 23, and the upper capacitor electrode is formed by sequentially stacking an AlCu film 24 (a second conductive film) and a TiN film 25. On the first insulating film 21, a second interconnect 26*b* (connected to an extension interconnect 22*a* extended from the lower capacitor electrode made of the first conductive layer) is formed by sequentially stacking the barrier metal film 22, the AlCu film 24, and the TiN film 25. Also formed on the first insulating film 21 is a second interconnect 26*c*, which is composed of the barrier metal film 22, the AlCu film 24 and the TiN film 25 that are stacked in sequence.

As shown in FIG. 2, the barrier metal film 22 serving as the lower capacitor electrode of the MIM capacitor 26*a* is extended from the MIM capacitor to form an interconnect between the MIM capacitor and the interconnect 26*b*. The part of the barrier metal film 22 that is located between the MIM capacitor 26*a* and the second interconnect 26*b* will be hereinafter referred to as the extension interconnect 22*a*.

On the first insulating film 21, a second insulating film 27 whose surface is planarized is formed so as to cover the MIM capacitor 26*a*, the second interconnects 26*b* and 26*c* and the extension interconnect 22*a*. In the second insulating film 27, contacts 28*a* and 28*b* are formed. The contacts 28*a* made of a W film are connected with the MIM capacitor 26*a*, while the contact 28*b* also made of the W film is connected with the second interconnect 26*b*. Moreover, third interconnects 29*a* and 29*b*, which are made of an identical conductive film, are formed on the second insulating film 27. The third interconnect 29*a* is connected via the contacts 28*a* to the MIM capacitor 26*a*, while the third interconnect 29*b* is connected via the contact 28*b* to the second interconnect 26*b*.

As described above, as in the first embodiment, the lower capacitor electrode and upper capacitor electrode of the MIM capacitor 26*a* are formed using the interconnect layers covered by the second insulating film 27 in the integrated circuit inside the chip. Therefore, in forming the upper capacitor electrode, a new conductive film other than the films that form the interconnects is not necessary. Furthermore, in the first embodiment, voltages for the upper capacitor electrode and lower capacitor electrode of the MIM capacitor are supplied from the third interconnect 13*a* and the first interconnect 3*a*, respectively. However, in this embodiment, voltages for the upper capacitor electrode and lower capacitor electrode of the MIM capacitor 26*a* can be supplied from the respective third interconnects 29*a* and 29*b* that are both made of the identical conductive film. It should be noted that the first embodiment has an advantage over this embodiment in terms of the area occupied by the MIM capacitor and the voltage supply interconnect layers.

Moreover, in the structure of the semiconductor device of this embodiment, if the barrier metal film 22 has a multilayer structure of TiN and Ti films each having a thickness of 20 nm, the sheet resistance of the barrier metal film 22 is 30 Ω/□, which is low enough for the barrier metal film 22 to be used as the extension interconnect 22*a*.

As mentioned above, according to this embodiment, the barrier metal film 22, which forms the lower capacitor electrode and the extension interconnect 22*a*, is used as the extension interconnect 22*a*. This allows the interconnects to have a shorter length, while suppressing the parasitic resistance, as compared with a structure such as the prior art example (shown in FIG. 10) in which interconnects and contacts are formed separately and connected with a lower capacitor electrode. Furthermore, as in the first embodiment, in the LSI semiconductor having submicron devices, the difference in level, which is equal to the film thickness of the upper capacitor electrode, can be reduced, while the MIM capacitor can be formed with a reduced number of process steps.

(Third Embodiment)

Figure 3:
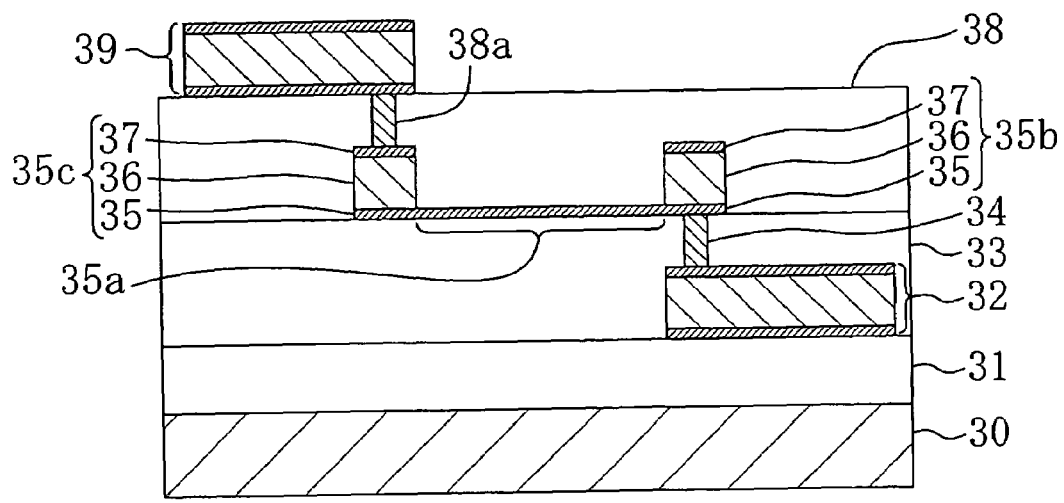
FIG. 3 is a cross sectional view of a semiconductor device in accordance with a third embodiment of the present invention.

FIG. 3 is a cross sectional view of a semiconductor device in accordance with a third embodiment of the present invention, and illustrates a resistor.

As shown in FIG. 3, a first interconnect 32 is formed on an insulating film 31 formed on a semiconductor substrate 30. On the insulating film 31, a first insulating film 33 whose surface is planarized is formed so as to cover the first interconnect 32. In the first insulating film 33, a contact 34 filled with a W film is formed.

On the first insulating film 33 and the contact 34, a resistor 35*a* made of a barrier metal film 35 (a first conductive film) is formed. On the left and right ends of the resistor 35*a*, resistor electrodes 35b and 35c are formed by stacking the barrier metal film 35, an AlCu film 36 (a second conductive film) and a TiN film 37. The resistor 35a and the resistor electrodes 35b and 35c form a resistor element. A second insulating film 38 whose surface is planarized is formed on the first insulating film 33 so as to cover the resistor 35a and the resistor electrodes 35b and 35c. In the second insulating film 38, a contact 38a filled with a W film is formed. On the second insulating film 38, a third interconnect 39 is formed.

The resistor electrodes 35b and 35c are formed using interconnect layers covered with the second insulating film 38 in the integrated circuit inside the chip, and can be formed simultaneously with the interconnects. The resistor 35a is formed using the barrier metal film 35 forming the interconnect layers covered with the second insulating film 38. The contact 34 electrically connects the first interconnect 32 with the resistor electrode 35b, while the contact 38a electrically connects the third interconnect 39 and the resistor electrode 35c.

Moreover, in the structure of the semiconductor device of this embodiment, if the barrier metal film 35 has a multilayer structure of TiN and Ti films each having a thickness of 20 nm, the sheet resistance of the resistor 35a made of the barrier metal film 35 becomes 30 $\Omega/\square$.

As described above, in this embodiment, the resistor 35a for an analog circuit is formed using the barrier metal film 35 forming the interconnect layers covered with the second insulating film 38 in the integrated circuit inside the chip. Thus, parasitic resistance can be reduced, as compared with a resistor made of a polysilicon film as in the prior art example, and even if the resistor is provided in series with inner interconnects in the integrated circuit, it is possible to avoid a situation in which characteristics of the integrated circuit are adversely affected by the parasitic resistance of the interconnects going toward inside. Furthermore, since the barrier metal film 35 made of a refractory metal or a metal compound such as a nitride of the refractory metal is used for the resistor 35a, variation in parasitic resistance can be reduced, unlike in the case of the conventional polysilicon-film resistor.

(Fourth Embodiment)

Figure 4:
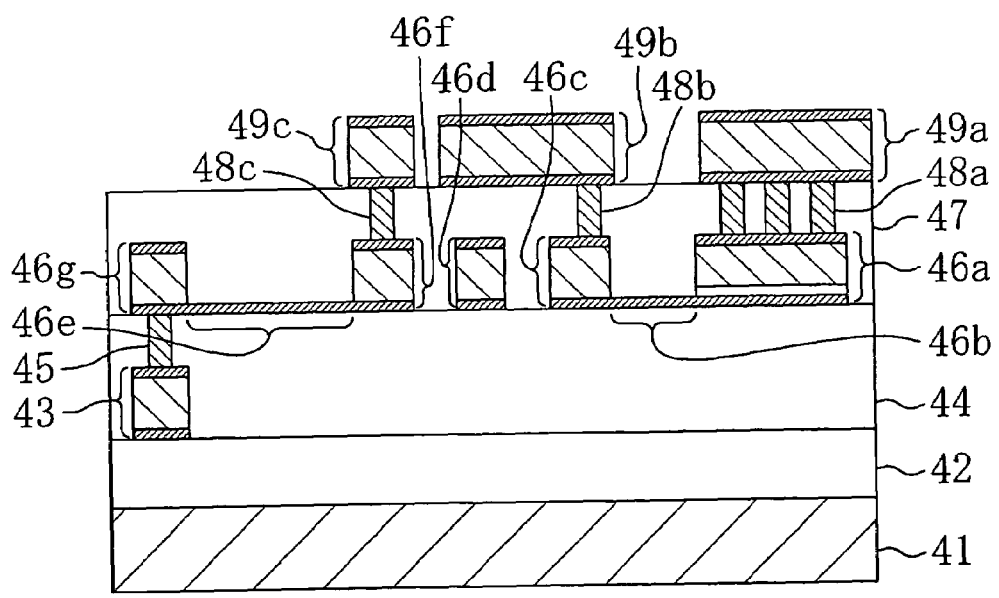
FIG. 4 is a cross sectional view of a semiconductor device in accordance with a fourth embodiment of the present invention.

FIG. 4 is a cross sectional view of a semiconductor device in accordance with a fourth embodiment of the present invention, and illustrates a cross sectional view of the semiconductor device in which a MIM capacitor having a structure such as shown in FIG. 2 and a resistor having a structure such as shown in FIG. 3 are formed together.

As shown in FIG. 4, a first interconnect 43 is formed on an insulating film 42 formed on a semiconductor substrate 41. On the insulating film 42, a first insulating film 44 whose surface is planarized is formed so as to cover the first interconnect 43. In the first insulating film 44, a contact 45 filled with a W film is formed. As in the second embodiment, on the first insulating film 44 and the contact 45, a MIM capacitor 46a, an extension interconnect 46b, and second interconnects 46c and 46d are formed. The MIM capacitor 46a is formed using the same film layers as the corresponding layers shown in FIG. 2. As in the third embodiment, a resistor 46e and resistor electrodes 46f and 46g are also formed on the first insulating film 44 and the contact 45 by using the same film layers as the corresponding layers shown in FIG. 3.

As in the second and third embodiments, a second insulating film 47 whose surface is planarized is formed so as to cover the MIM capacitor 46a, the extension interconnect 46b, the resistor 46e, the second interconnects 46c and 46d, and the resistor electrodes 46f and 46g. In the second insulating film 47, contacts 48a through 48c filled with a W film are formed. Moreover, third interconnects 49a through 49c are formed on the second insulating film 47 and the contacts 48a through 48c.

As has been mentioned above, according to this embodiment, the MIM capacitor 46a, the extension interconnect 46b, the resistor 46e, the second interconnects 46c and 46d, and the resistor electrodes 46f and 46g are formed using the films forming the interconnect layers covered with the second insulating film 47 in the integrated circuit inside the chip, thereby realizing the effects of both the second and third embodiments. It should be noted that although in this embodiment, the MIM capacitor 46a and the resistor 46e are formed using the films forming the interconnect layers covered by the second insulating film 47 in the integrated circuit inside the chip, the MIM capacitor 46a and the resistor 46e may be formed using films that form different interconnect layers (that is, interconnect layers such as the first interconnect 43 or the third interconnects 49a through 49c, for example.) Moreover, in the structure of the semiconductor device of this embodiment, if a 30-nm thick TiN film is used as the barrier metal film 22, the sheet resistance of the resistor 46e and the extension interconnect 46b, both made of the barrier metal film 22, becomes about 40 $\Omega/\square$, so that parasitic resistance can be reduced, while variation in the parasitic resistance can be suppressed.

(Fifth Embodiment)

FIGS. 5A through 5C and FIGS. 6A through 6C are cross sectional views illustrating a method for fabricating a semiconductor device in accordance with a fifth embodiment of the present invention, and particularly illustrate a method for fabricating a semiconductor device which has a MIM capacitor such as shown in FIG. 1.

Figure 5A:
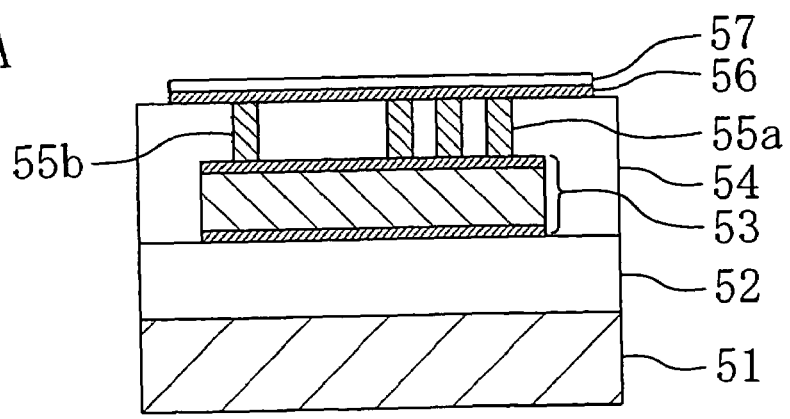
FIGS. 5A through 5C are cross sectional views illustrating a method for fabricating a semiconductor device in accordance with a fifth embodiment of the present invention.

First, as shown in FIG. 5A, a first interconnect 53 is formed on an insulating film 52 formed on a semiconductor substrate 51, after which a first insulating film 54 whose surface is planarized is formed so as to cover the first interconnect 53. Next, contact holes, which are connected to the upper surface of the first interconnect 53, are formed in the first insulating film 54, and then filled with a W film, thereby forming contacts 55a and 55b. Subsequently, on the first insulating film 54 and the contacts 55a and 55b, a TiN film with a thickness of 30 nm is deposited as a barrier metal film 56 (a first conductive film) by a sputtering process. Thereafter, a SiO$_2$ film 57 (a dielectric film) with a thickness of 50 nm is deposited on the barrier metal film 56 by a CVD process in an atmosphere of mono-silane and N$_2$O gases at 370° C.

Figure 5B:
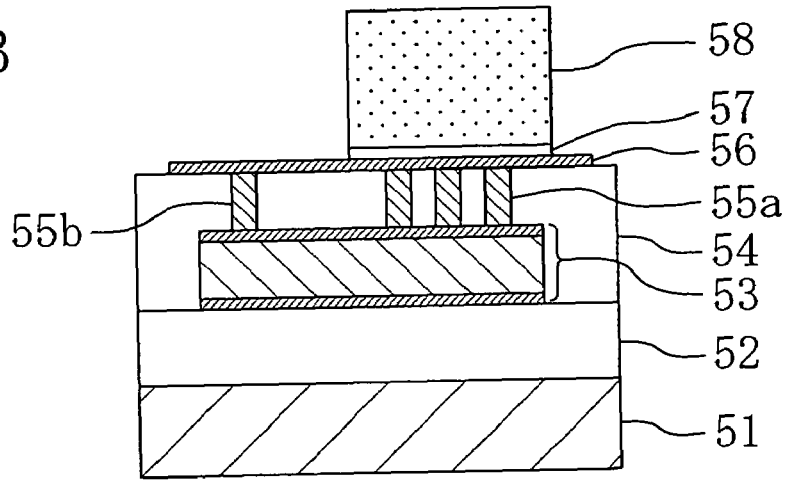

Then, as shown in FIG. 5B, a resist pattern 58 is formed in a region (a first region) which is on the SiO$_2$ film 57 and in which a MIM capacitor is to be formed. Thereafter, the SiO$_2$ film 57 is selectively dry-etched using a mixed gas of CF$_4$ and CHF$_3$, with the resist pattern 58 being used as a mask.

Figure 5C:
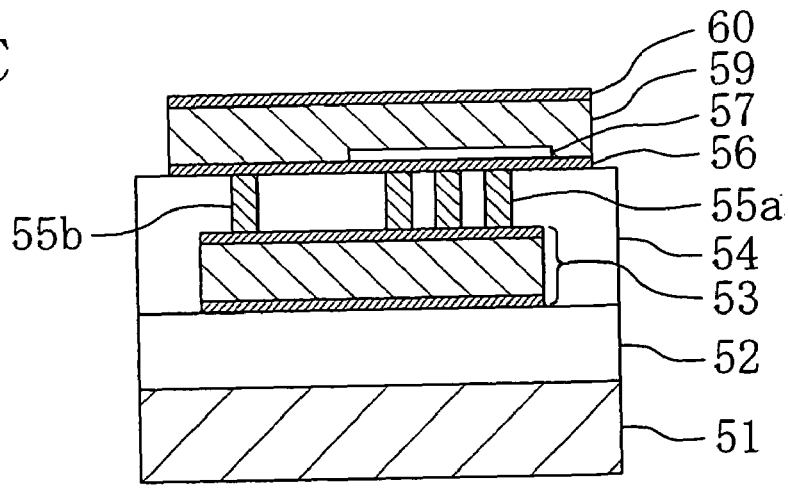

Next, as shown in FIG. 5C, the resist pattern 58 is removed by ashing and cleaning techniques, after which an AlCu film 59 (a second conductive film) with a thickness of 450 nm is deposited on the barrier metal film 56 and the SiO$_2$ film 57 by a sputtering process. A TiN film 60 having a thickness of 30 nm is then deposited on the AlCu film 59.

Figure 6A:
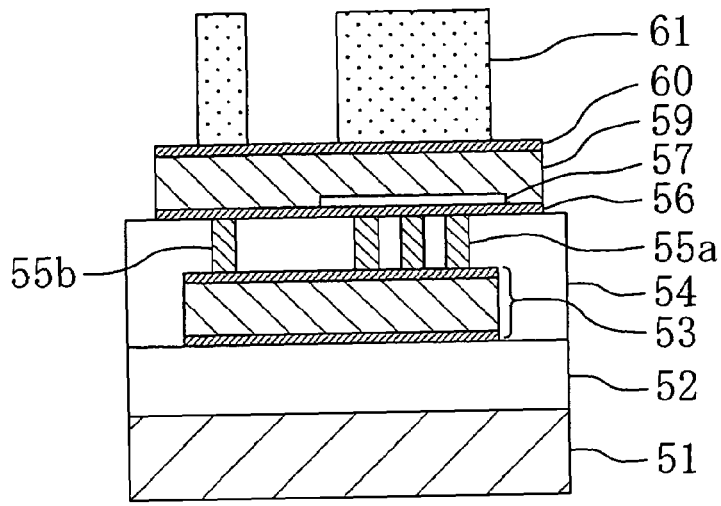
FIGS. 6A through 6C are cross sectional views illustrating the method for fabricating the semiconductor device in accordance with the fifth embodiment of the present invention.

Subsequently, as shown in FIG. 6A, a resist pattern 61 is formed in a region (a second region) which is located on the TiN film 60 and in which an interconnect is to be formed, and in a region which is located on the TiN film 60, and in which the MIM capacitor is to be formed, and below which the SiO$_2$ film 57 is present.

Figure 6B:
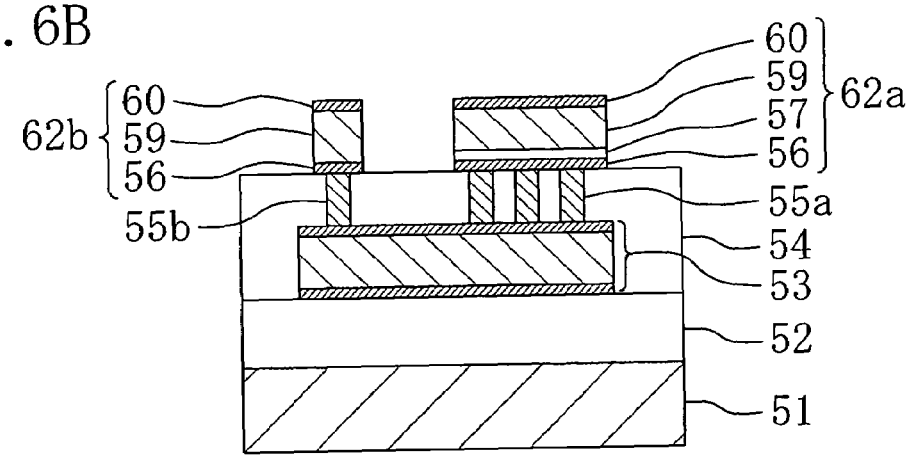

Next, as shown in FIG. 6B, with the resist pattern 61 serving as a mask, the TiN film 60, the AlCu alloy film 59, the SiO$_2$ film 57, and the barrier metal film (TiN film) 56 are selectively dry-etched, thereby forming a MIM capacitor 62a and a second interconnect 62b.

Figure 6C:
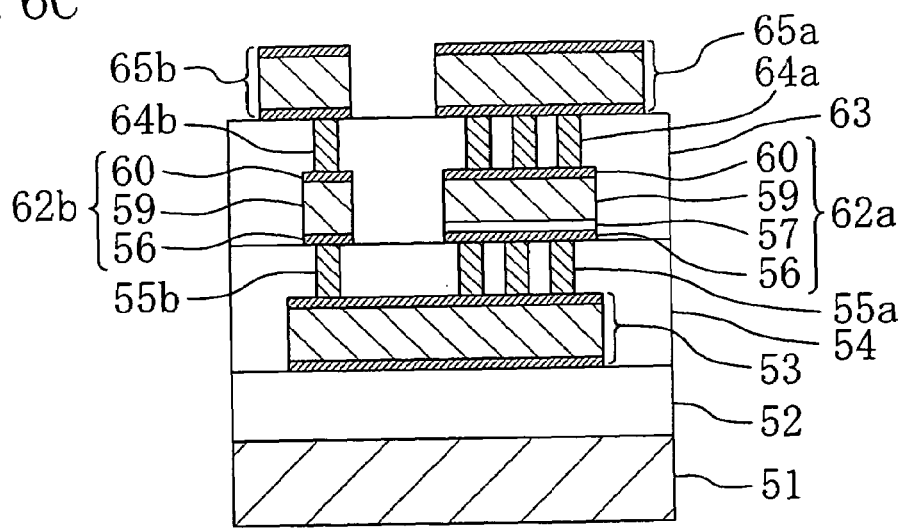

Then, as shown in FIG. 6C, a second insulating film 63 whose surface is planarized is formed on the first insulating film 54 so as to cover the MIM capacitor 62a and the second interconnect 62b. Thereafter, contact holes are formed in the second insulating film 63, and then filled with a W film, thereby forming contacts 64a and 64b. Then, third interconnects 65a and 65b are formed on the second insulating film 63 and the contacts 64a and 64b.

The lower capacitor electrode of the resultant MIM capacitor 62a consists of the barrier metal film (TiN film) 56, while the upper capacitor electrode thereof is composed of the multilayer film of the AlCu film 59 and the TiN film 60. The lower capacitor electrode is connected via the contacts 55a to the first interconnect 53, while the upper capacitor electrode is connected to the third interconnect 65a. This allows voltages to be applied to the upper capacitor electrode and the lower capacitor electrode.

Figure 10:
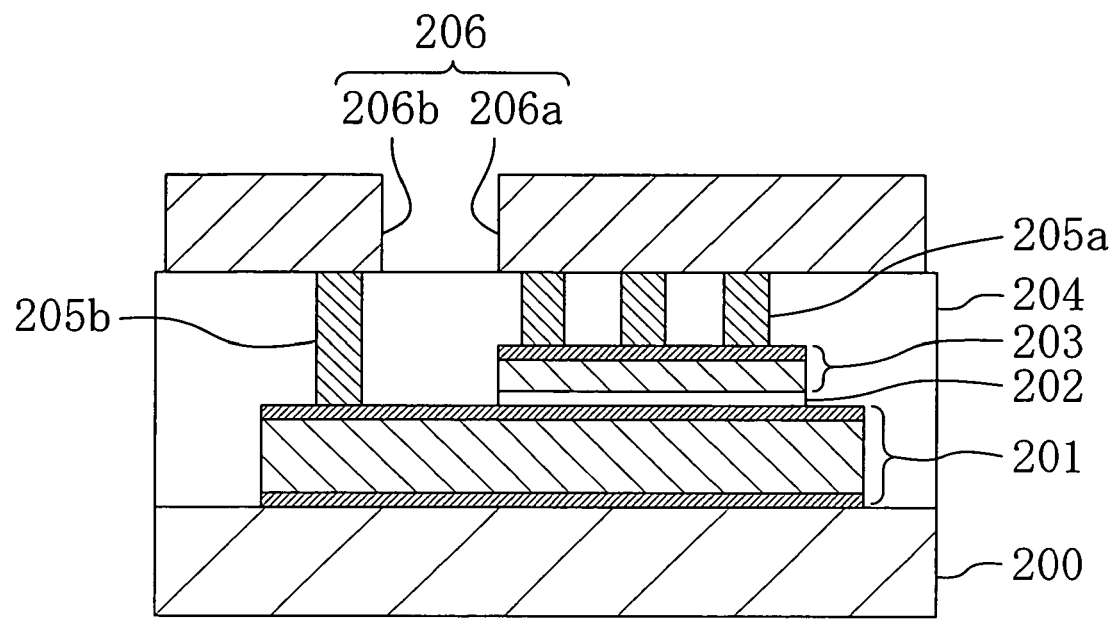
FIG. 10 is a cross sectional view illustrating a conventional MIM capacitor.
Figure 11:
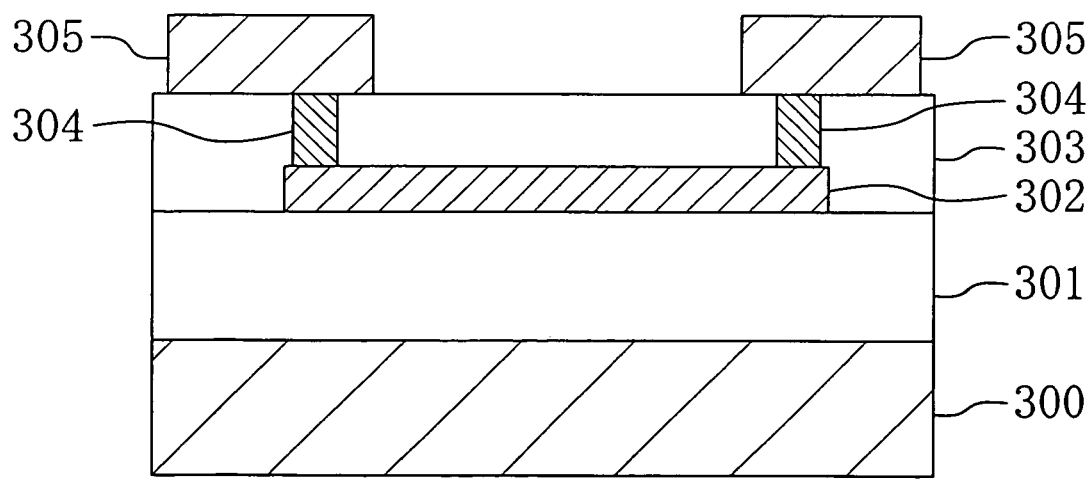
FIG. 11 is a cross sectional view illustrating a conventional resistor for an analog circuit.

As described above, according to this embodiment, the MIM capacitor 62a can be formed by just adding only one step of forming the SiO$_2$ film 57 serving as a dielectric film to the step in which the barrier metal film (TiN film) 56, the AlCu film 59, and the TiN film 60 are formed by using the step of fabricating the interconnects covered by the second insulating film 63 in the integrated circuit inside the chip. Therefore, unlike in a case where the conventional MIM capacitor shown in FIG. 10 is fabricated, an upper capacitor electrode formation step does not have to be separately added in this embodiment. Accordingly, it is possible to reduce the number of process steps for fabricating the highly large scale integration devices in which contacts have to be formed by filling contact holes with a W film, while fabrication costs can also be decreased.

(Sixth Embodiment)

FIGS. 7A through 7C and FIGS. 8A through 8C are cross sectional views illustrating a method for fabricating a semiconductor device in accordance with a sixth embodiment of the present invention, and illustrating a method for fabricating a semiconductor device such as shown in FIG. 4.

Figure 7A:
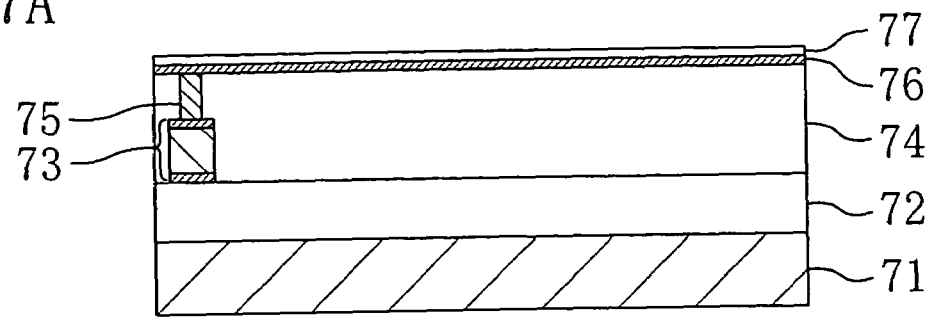
FIGS. 7A through 7C are cross sectional views illustrating a method for fabricating a semiconductor device in accordance with a sixth embodiment of the present invention.

First, as shown in FIG. 7A, a first interconnect 73 is formed on an insulating film (a first insulating film) 72 formed on a semiconductor substrate 71. A first insulating film 74 whose surface is planarized is then formed on the insulating film 72 so as to cover the first interconnect 73. Next, in the first insulating film 74, a contact hole, which is connected to the upper surface of the first interconnect 73, is formed, and then filled with a W film, thereby forming a contact 75. Subsequently, a TiN film with a thickness of 30 nm is deposited as a barrier metal film 77 (a first conductive film) on the first insulating film 74 and the contact 75 by a sputtering process. Thereafter, a SiO$_2$ film 77 with a thickness of 50 nm is deposited on the barrier metal film 76 by a CVD process in an atmosphere of mono-silane and N$_2$O gases at 370° C.

Figure 7B:
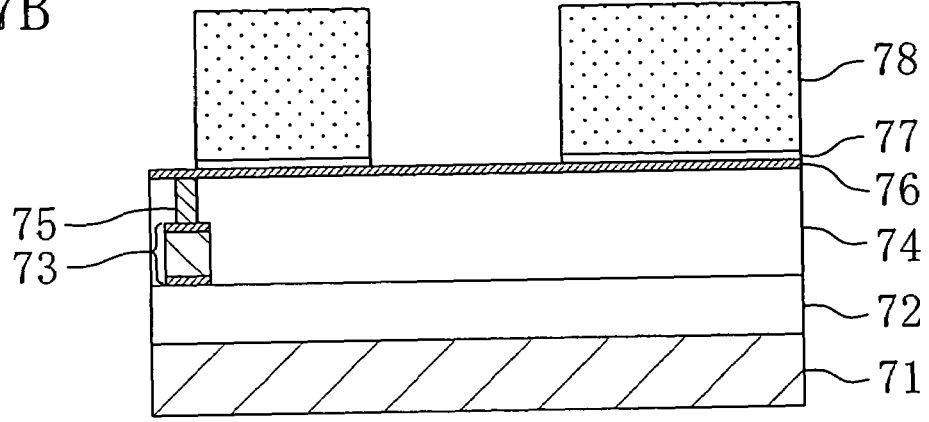

Then, as shown in FIG. 7B, a first resist pattern 78 is formed in a region (a third region) which is on the SiO$_2$ film 77 and in which at least a MIM capacitor and an extension interconnect are to be formed, and in a region (a fifth region) in which a resistor is to be formed. Thereafter, with the first resist pattern 78 being used as a mask, the SiO$_2$ film (a second insulating film) 77 is selectively dry-etched using a mixed gas of CF$_4$ and CHF$_3$, whereby the SiO$_2$ film 77 is left where the SiO$_2$ film 77 is located in the regions in which the MIM capacitor, the extension interconnect, and the resistor are to be formed.

Figure 7C:
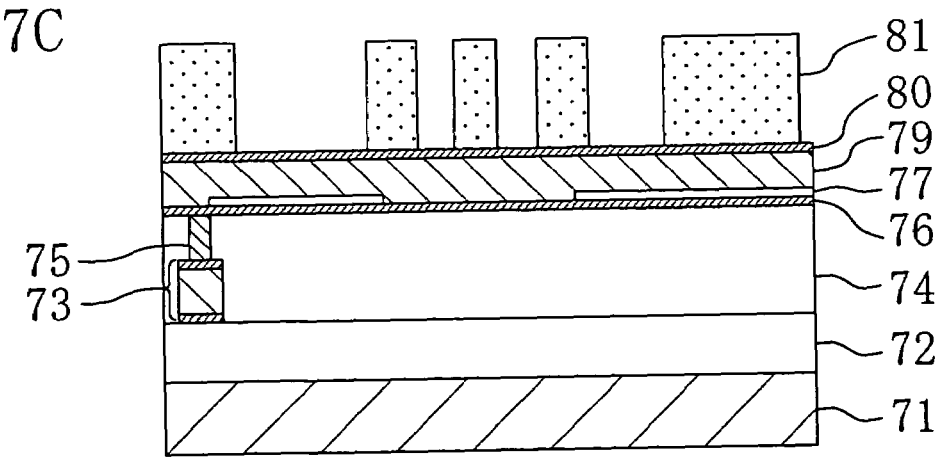

Next, as shown in FIG. 7C, the first resist pattern 78 is removed by ashing and cleaning techniques. Subsequently, an AlCu film 79 (a second conductive film) with a thickness of 450 nm is deposited on the barrier metal film 76 and the remaining SiO$_2$ film 77 by a sputtering process. A TiN film 80 with a thickness of 30 nm is then deposited on the AlCu film 79. Next, a second resist pattern 81 is formed in a region (included in a fourth or sixth region) in which a second interconnect is to be formed, in the region in which the MIM capacitor and the extension interconnect are to be formed, in the region in which the resistor is to be formed, and in a region (included in the fourth or sixth region) in which a second interconnect and resistor electrodes are to be formed.

Figure 8A:
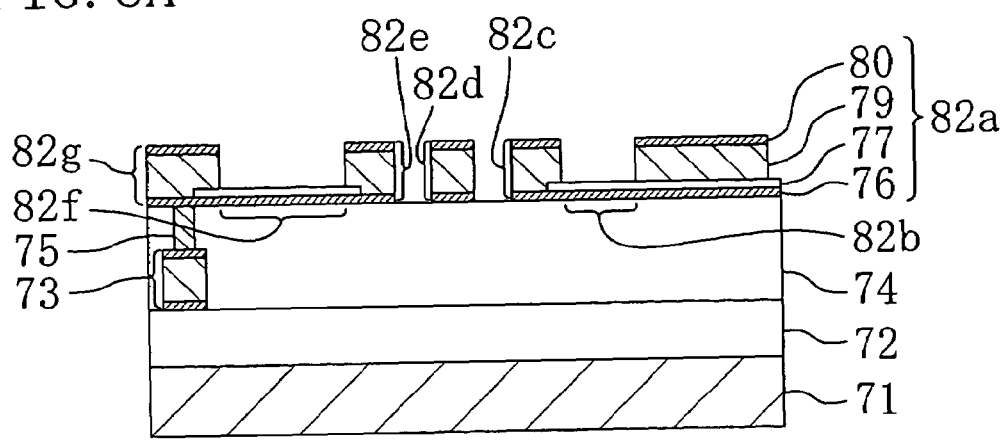
FIGS 8A and 8B are cross sectional views illustrating the method for fabricating the semiconductor device in accordance with the sixth embodiment of the present invention.

Next, as shown in FIG. 8A, with the second resist pattern 81 serving as a mask, the barrier metal film (TiN film) 76, the AlCu film 79, the SiO$_2$ film 77, and the TiN film 80 are dry etched using a dry-etching technique in which the selection ratio of the SiO$_2$ film 77 is high. In this process, the SiO$_2$ film 77 is hardly etched, allowing the formation of the extension interconnect 82b for the MIM capacitor 82a and the resistor 82f as well as the formation of the MIM capacitor 82a, second interconnects 82c and 82d, and resistor electrodes 82e and 82g.

Figure 8B:
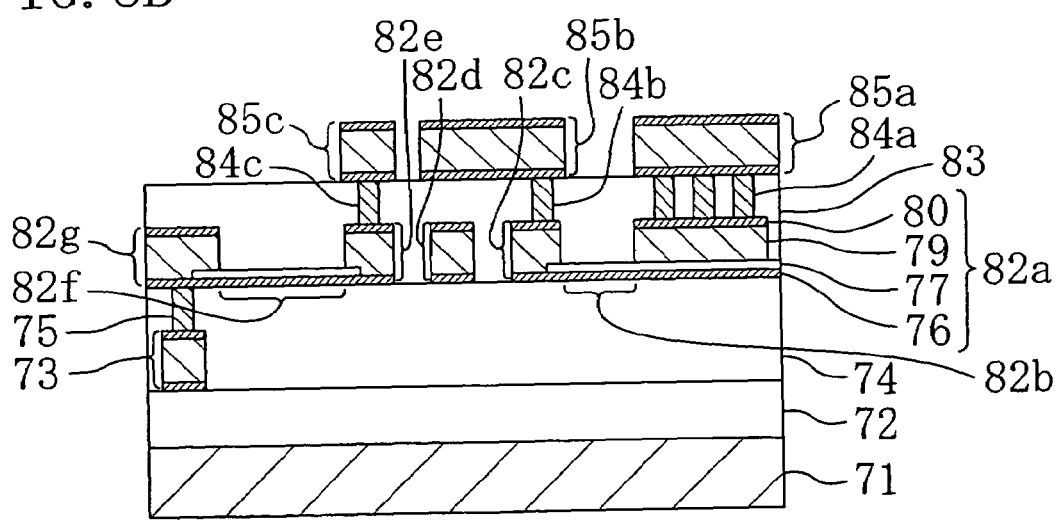
Figure 9:
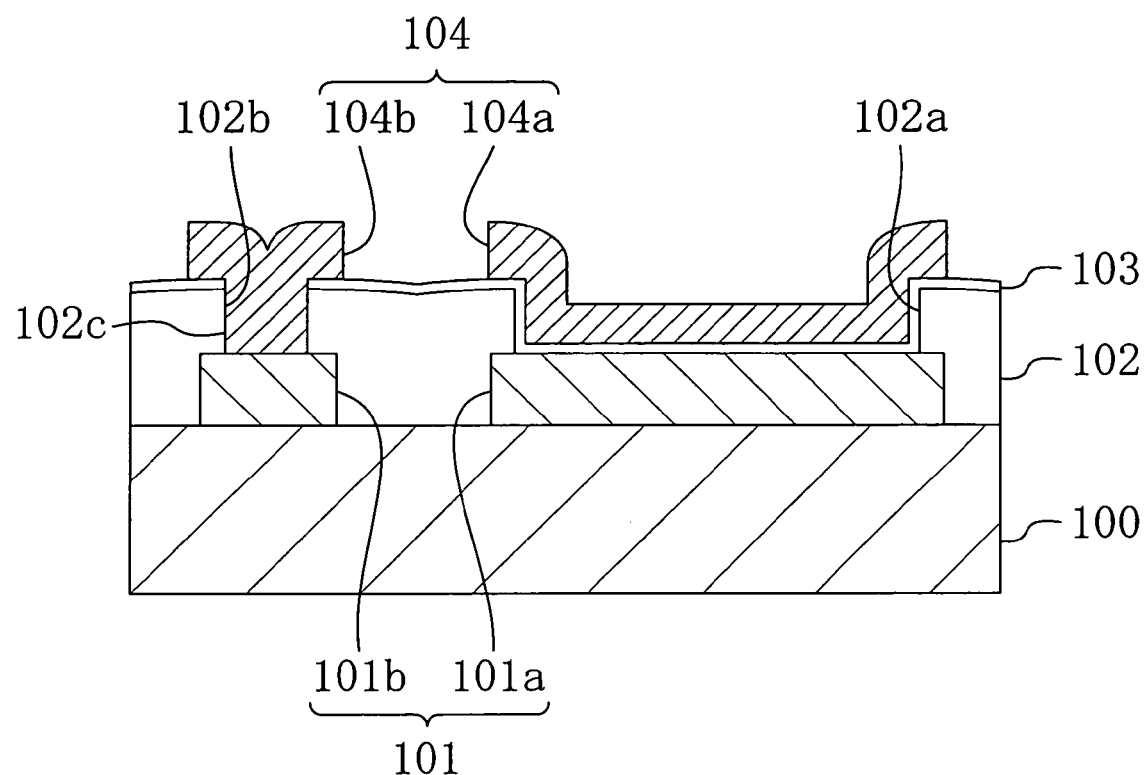
FIG. 9 is a cross sectional view illustrating a conventional MIM capacitor.

Subsequently, as shown in FIG. 8B, a second insulating film 83 is formed on the first insulating film 74 so as to cover the MIM capacitor 82a, the extension interconnect 82b, the second interconnects 82c and 82d, the resistor 82f, and the resistor electrodes 82e and 82g located at the both ends of the resistor 82f. Next, contact holes are formed in the second insulating film 83, and then filled with a W film, thereby forming contacts 84a through 84c. The contacts 84a are connected with the MIM capacitor 82a, the contact 84b is connected with the second interconnect 82c, and the contact 84c is connected with the resistor electrode 82e. Then, third interconnects 85a through 85c are formed on the second insulating film 83. The third interconnect 85a is connected with the contacts 84a, the third interconnect 85b is connected with the contact 84b, and the third interconnect 85c is connected with the contact 84c.

As described above, according to this embodiment, the MIM capacitor 82a can be formed by adding only one step of forming the SiO$_2$ film 77 serving as a dielectric film to the step in which the barrier metal film (TiN film) 76, the AlCu film 79, and the TiN film 80 are formed by utilizing the step of fabricating the interconnects covered by the second insulating film 83 in the integrated circuit inside the chip. Therefore, unlike in a case in which the conventional MIM capacitor shown in FIG. 10 is fabricated, an upper capacitor electrode formation step does not have to be separately added in this embodiment. Accordingly, it is possible to reduce the number of process steps for fabricating the highly large scale integration devices in which contacts have to be formed by filling contact holes with a W film, while fabrication costs can also be decreased.

This embodiment describes a method in which the MIM capacitor 82a and the resistor 82f are formed by using the films that form the interconnect layers covered by the second insulating film 83. However, if necessary, the MIM capacitor 82a and the resistor 82f may be fabricated using films that form different interconnect layers. For instance, the MIM capacitor 82a may be formed by using films that form an interconnect layer composed of a multilayer structure of TiN film/AlCu film/TiN film, such as the first interconnect 73, while the resistor 82f may be formed by using films that form the second interconnect 82*d*, for example. In that case, the MIM-capacitor fabrication process steps explained in FIGS. 7 and 8 can be used for the MIM capacitor 82*a*. For the resistor, the process steps for fabricating a resistor, explained in FIGS. 7 and 8, may be used.

In the foregoing first through sixth embodiments, a TiN film or a multilayer film of a TiN film and a Ti film is used as the material for the barrier metal films. Nevertheless, in addition to this, a refractory metal film such as a Ti film, a W film, and a Ta film, a refractory metal silicide film, a refractory metal nitride film, or a refractory metal carbide film, for example, which also exhibits low resistivity, and is thus suitable for use as the main material for the barrier metal films, may be used singly or in combination, e.g., with a Ti film which acts as an adhesion layer with respect to an insulating film. Moreover, the barrier metal films may be formed using any films made of any material, so long as the desired sheet resistance can be obtained. Also, although in the foregoing embodiments, $SiO_2$ films are used as the dielectric films or the second insulating films, any films made of any material, such as SiO films, SiON films, SiN films, tantalum oxide films, or multilayer films of those films, may be used, so long as the resultant films can act as the dielectric films or the second insulating films.

As described above, according to the present invention, lower and upper capacitor electrodes are formed using first and second conductive films, respectively, that form an interconnect. Therefore, unlike in the prior art examples, a new conductive film other than those interconnect-forming films does not have to be used in the formation of the upper capacitor electrode. Accordingly, in the LSI semiconductor having submicron devices, the difference in level, which is equal to the film thickness of the upper capacitor electrode, can be reduced, while the capacitor can be formed with a reduced number of process steps. As a result, the costs can be reduced significantly, while the fabrication yield and performance of the semiconductor device can be improved considerably.

What is claimed is:

1. A semiconductor device comprising:
    an insulating film;
    an interconnect made of a first conductive film and a second conductive film that are stacked in sequence from the interconnect underside on the insulating film; on the insulating film, a capacitor composed of:
        a lower capacitor electrode made of the first conductive film;
        a dielectric film formed on the lower capacitor electrode; and
        an upper capacitor electrode made of the second conductive film and formed on the dielectric film,
    wherein each of the lower capacitor electrode, the dielectric film, and the upper capacitor electrode has a same pattern; and
    lower contacts are formed in the insulating film on a bottom surface of the lower capacitor electrode, the lower contacts being connected to the lower capacitor electrode.

2. The semiconductor device of claim 1, wherein
    a lower insulating film is formed beneath the insulating film;
    a lower interconnect is formed on the lower insulating film; and
    the lower contacts are connected to the lower interconnect.

3. The semiconductor device of claim 1, wherein a surface of the insulating film on which the capacitor is formed is planarized.

4. The semiconductor device of claim 2, wherein
    an upper insulating film is formed so as to cover the capacitor and the interconnect; and
    upper contacts are formed in the upper insulating film on an upper surface of the upper capacitor electrode, the upper contacts being connected to the upper capacitor electrode.

5. The semiconductor device of claim 4, wherein
    an upper interconnect is formed on the upper insulating film; and
    the upper contacts are connected with the upper interconnect.

6. The semiconductor device of claim 1, wherein the first conductive film is made of a metal nitride.

7. The semiconductor device of claim 6, wherein the dielectric film is SiN.

8. The semiconductor device of claim 7, wherein the second conductive film is made of an aluminum alloy.

* * * * *